United States Patent [19]

Fukuda

[11] Patent Number: 5,065,413
[45] Date of Patent: Nov. 12, 1991

[54] PHASE LOCKED LOOP CIRCUIT

[75] Inventor: Shinichi Fukuda, Kanagawa, Japan

[73] Assignee: Sony Corporation, Tokyo, Japan

[21] Appl. No.: 602,408

[22] Filed: Oct. 22, 1990

[30] Foreign Application Priority Data

Dec. 9, 1989 [JP] Japan .................................. 1-319146
Dec. 9, 1989 [JP] Japan .................................. 1-319147

[51] Int. Cl.$^5$ .............................................. H03D 3/02
[52] U.S. Cl. ...................................... 375/120; 331/18; 360/51
[58] Field of Search .......................... 375/120; 360/51; 331/18, 49

[56] References Cited

U.S. PATENT DOCUMENTS 4,375,693  3/1983  Kuhn ..................................... 375/120
4,534,044  8/1985  Funke et al. .......................... 375/120

Primary Examiner—Benedict V. Safourek
Assistant Examiner—Young Tse
Attorney, Agent, or Firm—Philip M. Shaw, Jr.

[57] ABSTRACT

A phase locked loop circuit is arranged such that the frequency of an input reference clock signal is selected on the basis of a first or second transmission rate of an incoming digital signal, whereby an output digital signal correctly synchronized with the incoming digital signal having the first or second transmission rate can be transmitted. Also, the phase locked loop circuit is arranged so that a first or second central frequency value and a first or second boundary frequency value are set in response to the first or second transmission rate of the incoming digital signal so that, if a frequency value of an output digital signal lies outside of a range of the first or second boundary frequency values, the frequency of the output digital signal is set to the first or second central frequency values. Thus, the phase locked loop circuit of the invention can deliver the output digital signal correctly synchronized with the incoming digital signal having the first or second transmission rate.

6 Claims, 3 Drawing Sheets

PHASE LOCKED LOOP CIRCUIT

BACKGROUND OF THE INVENTION

1. Field of the Invention

The present invention relates generally to phase locked loop circuit and, more particularly, to a phase locked loop circuit suitable for use in extracting a bit clock signal from a signal reproduced by a rotary head of, for example, a digital audio tape recorder.

2. Description of the Prior Art

Rotary head type digital audio tape recorders have been used so far to record an audio signal on a magnetic tape at high recording density.

The digital audio tape recorder is referred to as a DAT for simplicity and records incoming audio data on a magnetic type wrapped around a rotary drum at a predetermined wrapping angle by rotary heads mounted on the rotary drum and/or reproduces recorded audio data from the magnetic tape by the rotary heads.

When predetermined digital audio data is reproduced from a reproduced signal provided by the rotary heads of the tape recording and/or reproducing apparatus such as the digital audio tape recorder and the like, a bit extracting clock signal (i.e., so-called bit clock signal) is needed. In order to obtain a bit clock signal synchronized with the reproduced signal, a clock reproducing circuit of a phase locked loop (PLL) circuit arrangement has been employed.

When a magnetic tape in which predetermined digital audio data are recorded according to the DAT format is reproduced, a rate (i.e., read-out rate) in which the reproduced signal is read out from the magnetic tape by the rotary heads can be freely determined from a principle standpoint.

Therefore, by switching the revolution rate of the rotary drum while the running speed of the magnetic tape is being kept constant, it is possible to reproduce recorded digital audio data at two read out rates. These rates are a normal speed mode in which the relative speed between the magnetic tape and the rotary head is 3.133 meters/second and half speed mode in which the relative speed is 1.567 meters/second.

When the frequency bands of the reproduced signals in the read out rate of the normal speed mode and in the read out rate in the half speed mode are compared with each other, the frequency band of 9.4 MHz is provided by the read out rate of the normal speed mode, while the frequency band of 4.7 MHz, which is ½ that of the former frequency band, is provided by the read out rate of the half speed mode.

Accordingly, while the frequency of the bit clock signal involved in the reproduced signal (the so-called transmission rate of the reproduced signal) becomes 9.4 MHz according to the normal speed mode read out rate, the frequency of 4.7 MHz, which is ½ that of the former frequency, is provided according to the half speed mode read out rate.

If bit clock signals are extracted from the reproduced signals having transmission rates which are different by a factor of two by using the same clock reproducing circuit, it is frequently observed that a so-called quasi-locked or pseudo-locked condition occurs in the PLL circuit forming the clock reproducing circuit. Broadly speaking, such a pseudo-locked condition tends to occur when the frequencies of the reproduced signal as the input digital signal and of the clock signal as the output digital signal are placed in a simple integer relationship.

If the pseudo-locked condition occurs, then the clock signal of 4.7 MHz will be transmitted even though the reproduced signal is reproduced at the normal speed read out rate or the clock signal of 9.4 MHz will be transmitted while the reproduced signal is reproduced at the half speed mode read out rate. As a result, the bit of the reproduced signal can not be correctly extracted by a digital signal processing circuit provided at the later stage. Then, the problem is presented that digital audio data involved in the reproduced signal can not be reproduced correctly.

OBJECTS AND SUMMARY OF THE INVENTION

Accordingly, it is an object of the present invention to provide an improved phase locked loop circuit which can eliminate the aforenoted shortcomings and disadvantages encountered with the prior art.

More specifically, it is an object of the present invention to provide a phase locked loop circuit which can obtain a correct output digital signal from an input digital signal in response to a first or second transmission rate.

It is another object of the present invention to provide a phase locked loop circuit in which a circuit arrangement can be simplified considerably.

It is a further object of the present invention to provide a phase locked loop circuit which can be suitably applied to a digital audio tape recorder.

As a first aspect of the present invention, a phase locked loop circuit is provided, in which a phase error between an input digital signal having a first or second transmission rate and an output digital signal is detected on the basis of an input reference clock signal and the frequency of the output digital signal is controlled in response to the phase error. This phase locked loop circuit is characterized in that the frequency of the input reference clock signal is selectively controlled in response to the first or second transmission rate of the input digital signal.

As a second aspect of the present invention, a phase locked loop circuit is provided, in which a phase error between an input digital signal having a first or second transmission rate and an output digital signal is detected and the frequency of the output digital signal is controlled in response to the phase error. This phase locked loop circuit comprises a lock range setting circuit for setting a first or second central frequency value and a first or second boundary frequency value in response to the first or second transmission rate, a lock range determining circuit for determining whether or not a frequency value of the output digital signal falls within a range of the first or second boundary frequency values set by the lock range setting circuit, and a frequency setting circuit for urging the output digital signal to have the frequency corresponding to the first or second central frequency values determined by the lock range setting circuit on the basis of the determined result of the lock range determining circuit if the frequency value of the output digital signal lies outside of the first or second boundary frequency values.

The preceding, and other objects, features and advantages of the present invention will be apparent in the following detailed description of preferred embodiments when read in conjunction with the accompanying drawings, in which like reference numerals are used to identify the same or similar parts in the several views.

BRIEF DESCRIPTION OF THE DRAWINGS

A better understanding of the objects, features and advantages of the invention can be gained from a consideration of the following detailed description of the preferred embodiments thereof in conjunction with the figures of the accompanying drawings, wherein.

DETAILED DESCRIPTION OF THE PREFERRED EMBODIMENTS

Figure 1:
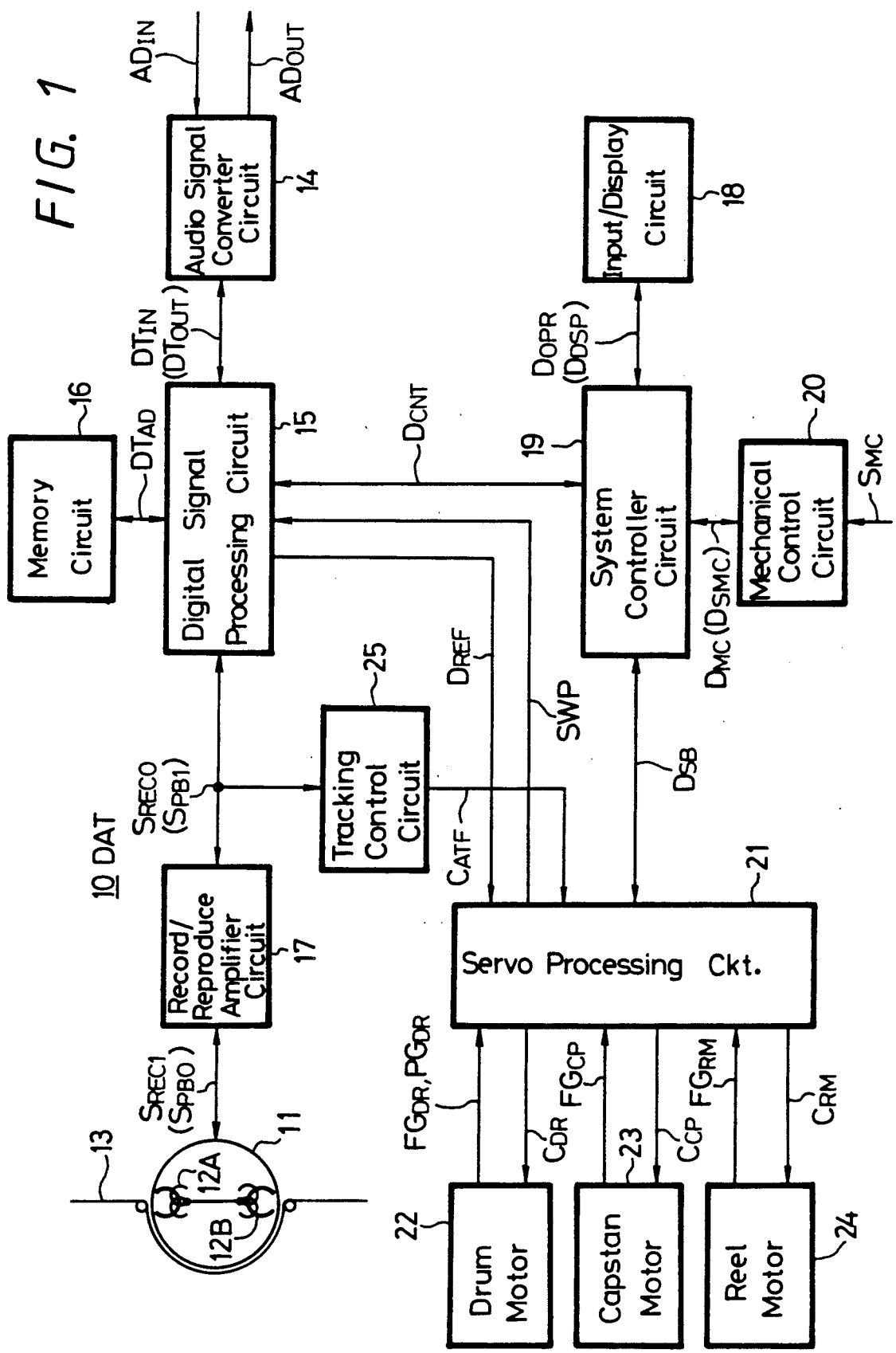
FIG. 1 is a block diagram showing an overall arrangement of a rotary head type digital audio tape recorder to which the present invention is suitably applied.

Referring to the drawings in detail, and initially to FIG. 1, an overall arrangement of a digital audio tape recorder will be described.

The digital audio tape recorder is what might be called a DAT and is generally represented by reference numeral 10 in FIG. 1. In the digital audio tape recorder 10, as shown in FIG. 1, predetermined audio signals $AD_{IN}$ and $AD_{OUT}$ are recorded on and/or played back from a magnetic tape 13 by rotary heads 12A, 12B. The two rotary heads 12A and 12B are mounted on a rotary drum 11 at an angular extent of substantially 180 degrees, and the magnetic tape 13 is wrapped around the rotary drum 11 at a predetermined wrapping angle.

In the digital audio tape recorder 10, upon recording, the input audio signal $AD_{IN}$ is supplied to an audio signal converter circuit 14 which, although not shown in the figure, includes a low-pass filter and an analog-to-digital converter circuit as a record signal processing system. In the audio signal converter circuit 14, the input analog audio signal $AD_{IN}$ is converted to digital data which is then fed to a record signal processing system in a digital signal processing circuit 15 as input digital data $DT_{IN}$.

The record signal processing system of the digital signal processing circuit 15 causes the input digital data $DT_{IN}$ to be temporarily stored in a memory circuit 16 formed of random access memory (RAM) as input audio data $DT_{AD}$.

Although not shown in the figure, the record signal processing system of the digital signal processing circuit 15 is comprised of an error correction code generating circuit, an interleave processing circuit, an eight-to-ten (8/10) converter circuit and the like.

In consequence, in the digital signal processing circuit 15, the input audio data $DT_{AD}$ written in the memory circuit 16 is read out by the error correction code generator circuit which then generates an error correction parity. Then, the error correction parity is written in the memory circuit 16.

The read and write processes of the memory circuit 16 are all performed by address data corresponding to interleaved data generated from the interleave processing circuit. Input audio data $DT_{AD}$ added with the error correction parity are read out from the memory circuit 16 by the 810 converter circuit.

The 8/10 converter circuit converts the input audio data $DT_{AD}$ of 8-bit data into 10-bit data so that the input audio data $DT_{AD}$ can be properly recorded on the magnetic tape 13 by the rotary heads 12A, 12B. The 8/10 converter circuit also adds a sync. (synchronizing) signal, an address signal, a subcode signal, an automatic track following (ATF) signal and the like to the input audio data $DT_{AD}$.

In the record signal processing system of the digital signal processing circuit 15, record data thus formed is converted to a record signal $S_{RECO}$ formed of serial data by a serial-to-parallel converter circuit provided therein, and the thus converted record signal $S_{RECO}$ is supplied to a record signal processing system of a record/reproduce amplifier circuit 17.

The record signal processing system of the record/reproduce amplifier circuit 17 is comprised of a record signal amplifier circuit, a rotary transformer and the like. Accordingly, the input record signal $S_{RECO}$ is amplified to provide an amplified record signal $S_{REC1}$ which is then supplied through the rotary transformer to the rotary heads 12A and 12B. In this fashion, the input audio signal $AD_{IN}$ can be recorded on the magnetic tape 13 at its predetermined record tracks.

The digital audio tape recorder 10 is selectively placed in the record mode or the playback mode on the basis of operation data $D_{OPR}$ that is supplied to a system controller circuit (i.e., microcomputer) 19 from an input/display circuit 18.

The input/display circuit 18 comprises, for example, a microcomputer having a key matrix provided as key input devices and a display panel having a liquid crystal display element as a display device. Therefore, the input/display circuit 18 responds to the user's key operation to output the operation data $D_{OPR}$ and performs a display on the display panel on the basis of display data $D_{DSP}$ supplied thereto from the system controller circuit 19.

On the basis of system information previously determined upon recording and the operation data $D_{OPR}$ inputted from the input/display circuit 18, the system controller circuit 19 generates a mechanical control data $D_{MC}$ signal, processing control data $D_{CNT}$ and servo processing control data $D_{SB}$ and supplies them to a mechanical control circuit 20, a digital signal processing circuit 15 and a servo processing circuit 21, respectively.

In actual practice, upon recording, the servo processing circuit 21 responds to the servo processing control data $D_{SB}$ from the system controller circuit 19 to supply a drum drive signal $C_{DR}$, a capstan drive signal $C_{CP}$ and a reel drive signal $C_{RM}$ to a drum motor 22, a capstan motor 23 and a reel motor 24, respectively, whereby the rotary drum 11 is rotated at a predetermined revolution rate and the magnetic tape 13 is transported at a predetermined speed, respectively.

At that time, a drum phase signal $PG_{DR}$ and a drum frequency signal $FG_{DR}$, a capstan frequency signal $FG_{CP}$ and a reel frequency signal $FG_{RM}$ are fed from the drum motor 22, the capstan motor 23 and the reel motor 24 back to the servo processing circuit 21, thereby effecting the velocity servo and the phase servo, respectively.

The servo processing circuit 21 is supplied with an inside reference signal $D_{REF}$ of the recording mode from the digital signal processing circuit 15 so that, on the basis of the inside reference signal $D_{REF}$ the servo processing circuit 21 performs velocity servo processing and phase servo processing. Simultaneously, the servo processing circuit 21 supplies the digital signal processing circuit 15 with a switching reference signal SWP that is generated on the basis of the input drum phase signal $PG_{DR}$ and drum frequency signal $FG_{DR}$ to switch the rotary heads 12A and 12B.

The mechanical control circuit 20 responds to the mechanical control data $D_{MC}$ from the system control circuit 19 to drive and control a cassette loading mechanism (not shown) of the DAT cassette and the tape loading mechanism (not shown) of the magnetic tape 13. The mechanical control circuit 20 also responds to a sensor information signal $S_{MC}$ from a mechanical mechanism portion (not shown) to generate mechanical information data $D_{SMC}$ which is then fed to the system controller circuit 19.

In the digital audio tape recorder 10, upon playback, the servo processing circuit 21 rotates the drum motor 22 at a revolution rate corresponding to the servo processing control data $D_{SB}$ from the system controller circuit 19 and with a phase synchronized with the playback inside reference signal $D_{REF}$ supplied thereto from the digital signal processing circuit 15, thereby effecting the velocity servo and the phase servo.

In this state, a reproduced signal $S_{PBO}$ from the rotary heads 12A, 12B is supplied to a reproduced signal processing system in the record/playback amplifier circuit 17 which, although not shown in the figure, includes a rotary transformer, a reproduced signal amplifying circuit, a waveform equalizing circuit, a binary coding circuit and the like. Then, a resultant digital signal $S_{PB1}$ is supplied to the reproduced signal processing system in the digital signal processing circuit 15 and to a tracking control circuit 25.

In this digital audio tape recorder 10, the tracking control circuit 25 performs the tracking control, for example, in an automatic track following (ATF) fashion. More specifically, the tracking control circuit 25 includes a waveform equalizing circuit (not shown) for detecting a sync. signal. The tracking control circuit 25 detects an ATF signal at a timing in which the sync. signal is detected from the input reproduced digital signal $S_{PB1}$ and forms an ATF control signal $C_{ATF}$ in response to the ATF signal. This ATF control signal $C_{ATF}$ is supplied to the servo processing circuit 21.

Accordingly, the servo processing circuit 21 responds to the ATF control signal $C_{ATF}$ to servocontrol the capstan motor 23, whereby an ATF servo loop is formed so that the rotary heads 12A and 12B can accurately scan the recorded tracks on the magnetic tape 13.

In the event that the rotary heads 12A and 12B accurately trace the recorded tracks on the magnetic tape 13, the reproduced signal processing system in the digital signal processing circuit 15 begins to reproduce the reproduced digital signal $S_{PB1}$ supplied thereto.

Although not shown in the figure, the reproduced signal processing system in the digital signal processing circuit 15 is comprised of a clock reproducing circuit of a phase locked loop (PLL) circuit arrangement, a ten-to-eight (10/8) reconverting circuit, an error detection/correction circuit, a de-interleave processing circuit, an interpolation circuit and the like.

In the digital signal processing circuit 15, initially, a reproduced clock signal involved in the reproduced digital signal $S_{PB1}$ is detected by the clock reproducing circuit.

Having detected the sync. signal in the reproduced digital signal $S_{PB1}$, the 10/8 re-converting circuit reconverts to 8-bit data the 10-bit data of the reproduced digital signal $S_{PB1}$ on the basis of the reproduced clock signal detected by the clock reproducing circuit. The resultant 8-bit data are sequentially written in the memory circuit 16 as reproduced audio data $DT_{AD}$.

The error detection/correction circuit reads out the reproduced audio data $DT_{AD}$ written in the memory circuit 16 and detects the presence or absence of data error therein. If data error exists, the error detection/correction circuit corrects the error by using an error correction parity and the error-corrected data and the corrected result are written in the memory circuit 16.

The write and read of the memory circuit 16 are all carried out on the basis of address data corresponding to de-interleaved data generated by the de-interleave processing circuit (not shown). Reproduced audio data $DT_{AD}$ error-detected and error-corrected is read out by the interpolation circuit. Thus, the interpolation circuit interpolates the data that can not be error-corrected fully by an interpolation calculation where a mean value of the preceding and the succeeding data is calculated. The interpolated data is supplied to the reproduced signal processing system in the audio signal converting circuit 14 as a reproduced digital data $DT_{OUT}$.

Although not shown in the figure, the reproduced signal processing system in the audio signal converting circuit 14 is comprised of a digital-to-analog converting circuit and a low-pass filter, whereby the reproduced digital data $DT_{OUT}$ is converted to an analog signal and this analog audio signal is transmitted as a reproduced audio signal $AD_{OUT}$.

In this fashion, the rotary heads 12A and 12B mounted on the rotary drum 11 scan the recorded tracks on the magnetic tape 13 to reproduce data recorded on the magnetic tape 13, thereby providing the reproduced audio signal $AD_{OUT}$.

Figure 2:
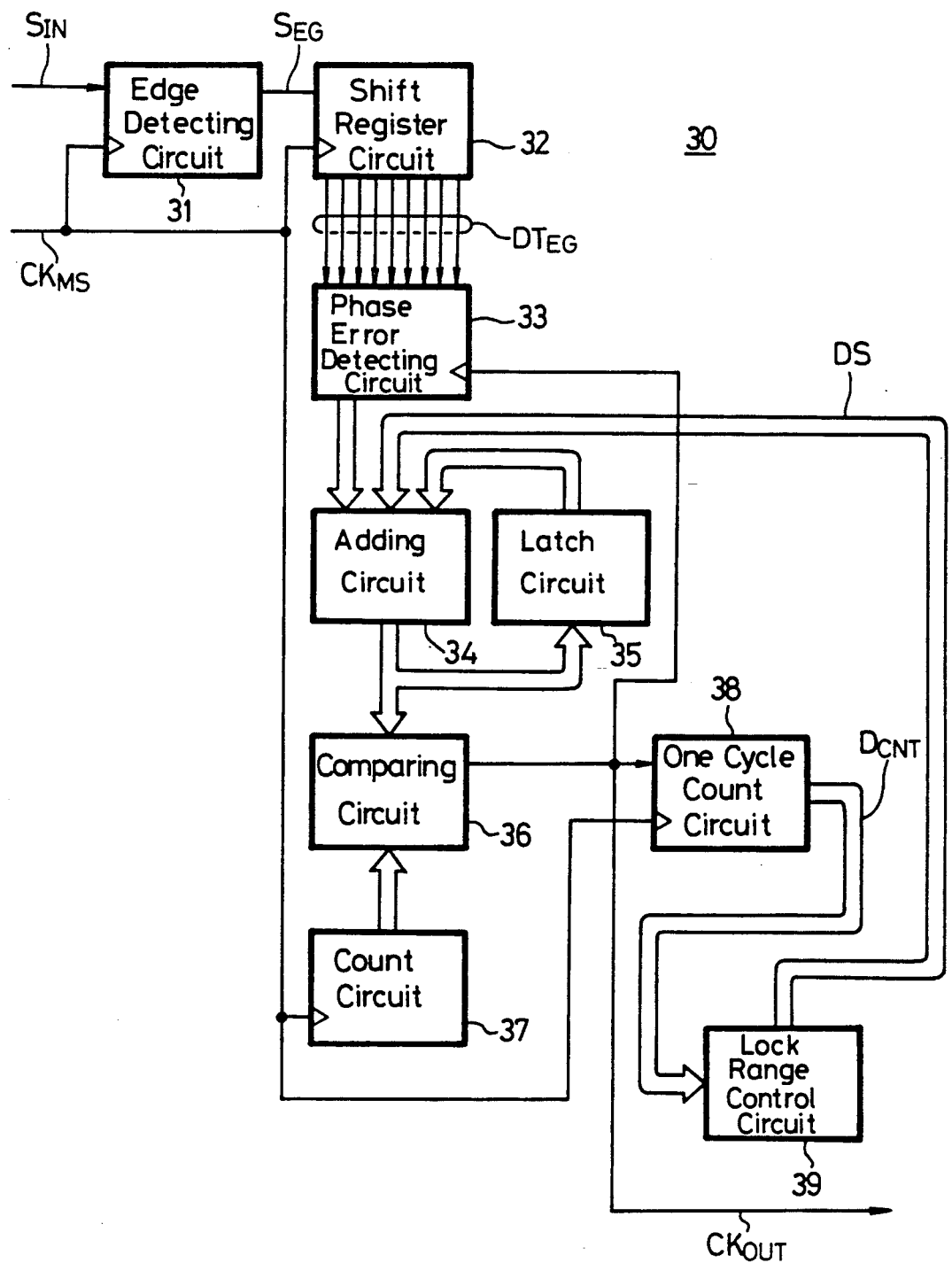
FIG. 2 is a block diagram showing an embodiment of a phase locked loop circuit according to an embodiment of the present invention.
Figure 3:
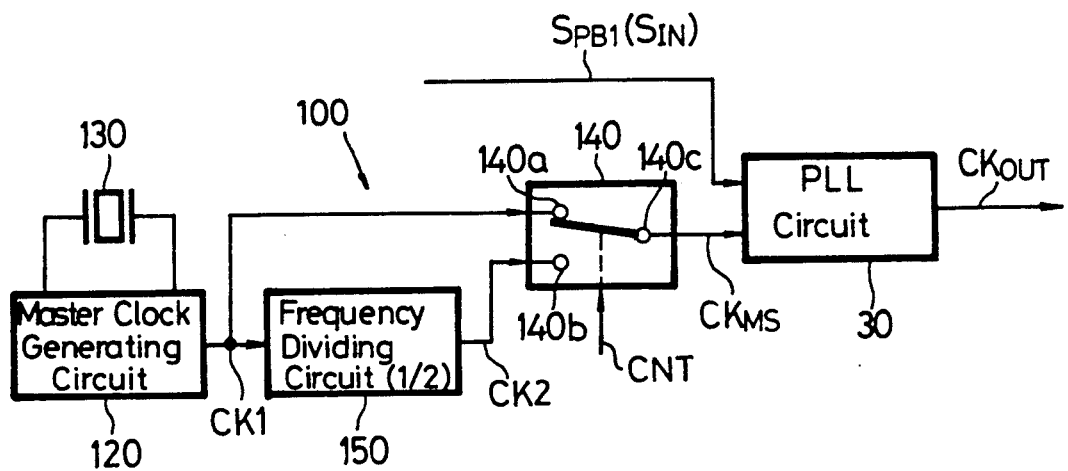
FIG. 3 is a block diagram showing an example of a clock reproducing circuit used in the embodiment of the invention.
Figure 4:
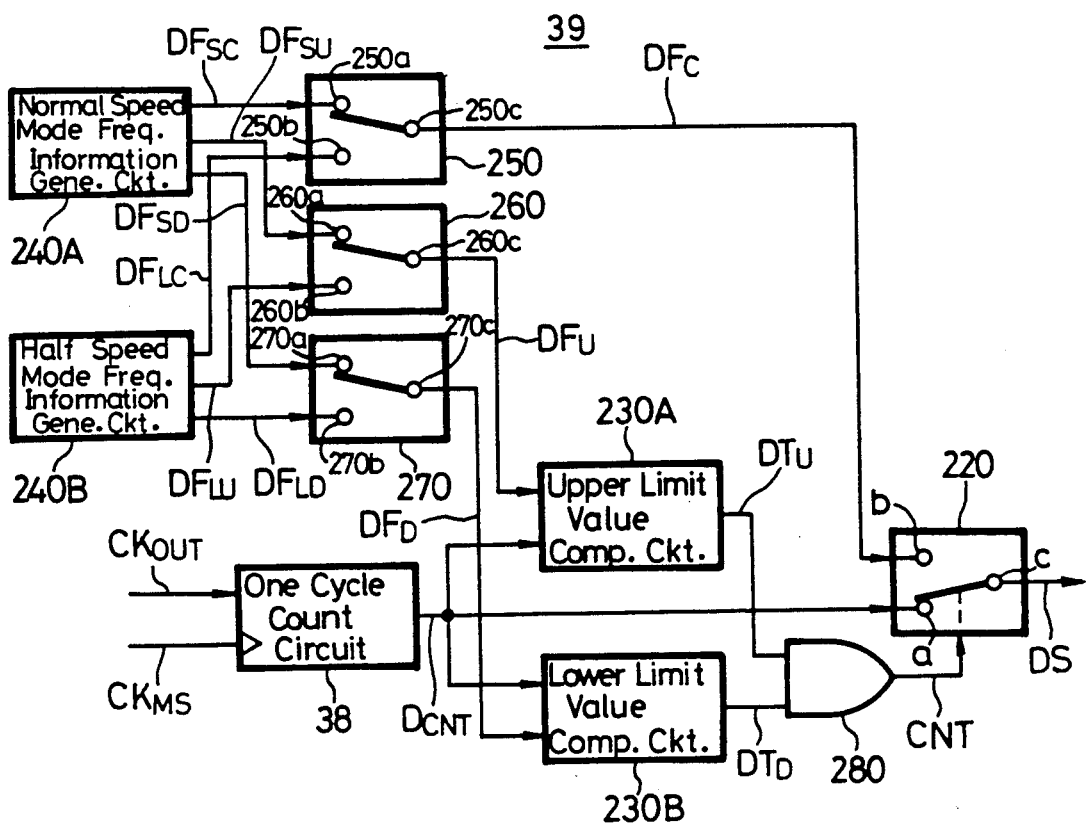
FIG. 4 is a block diagram showing an example of a lock range processing circuit used in the embodiment of the present invention.

Hereinafter the circuits of FIGS. 2-4, inclusive, will be described in greater detail. All of these circuits are a part of the digital signal processing circuit 15. FIG. 2 depicts a phase locked loop (PLL) circuit 30 in general detail. FIG. 3 depicts the PLL circuit 30 along with a circuit for producing a master clock signal $CK_{MS}$ whose frequency corresponds to the read rate of the reproduced digital signal $S_{PB1}$. This master clock signal $CK_{MS}$ is used by the PLL circuit 30. FIG. 4 depicts in greater detail the lock range control circuit 39 which is a part of the PLL circuit 30.

Referring to FIG. 2, there is shown the phase locked loop (PLL) circuit 30 that is used in the clock reproducing circuit of the digital signal processing circuit 15. In this embodiment, this PLL circuit 30 could be a digital PLL circuit disclosed in Japanese Patent Laid-Open Gazette Nos. 64-2419 and 64-11418, for example.

More specifically, the PLL circuit 30 is comprised of three circuit sections, that is, a phase error correcting circuit section, an output clock generating circuit section, and a lock range control circuit. The phase error correcting circuit section comprises an edge detecting circuit 31, a shift register circuit 32 and a phase error detecting circuit 33 to detect and correct a phase error between an input digital signal $S_{IN}$ and an output clock signal $CK_{OUT}$. The output clock generating circuit section comprises an adding circuit 34, a latch circuit 35, a comparing circuit 36 and a count circuit 37 to generate the output clock signal $CK_{OUT}$. The lock range control circuit comprises a one cycle counting circuit 38 and a lock range control circuit 39 to generate one cycle data DS that indicates how many cycles of a master clock signal $CK_{MS}$ correspond to one cycle of the output clock signal $CK_{OUT}$.

The reproduced digital signal $S_{PB1}$ from the record-/reproduce amplifier circuit 17 in the digital audio tape recorder 10 is supplied to the edge detecting circuit 31 as the input digital signal $S_{IN}$ together with a high speed master clock signal $CK_{MS}$.

The master clock signal $CK_{MS}$ has a frequency (e.g., 49.152 MHz) as high as the bit clock frequency of the input digital signal $S_{IN}$ predetermined times. In that case, the bit clock frequency is 9.4 MHz according to the reading rate in the normal speed mode.

The edge detecting circuit 31 detects an edge of the input digital signal $S_{IN}$ on the basis of the timing of the master clock signal $CK_{MS}$ and supplies an edge detected signal $S_{EG}$ to the next shift register circuit 32, together with the master clock signal $CK_{MS}$.

The shift register circuit 32 converts the input edge detection signal $S_{EG}$ into parallel data $DT_{EG}$ and supplies the parallel data $DT_{EG}$ to the phase error detecting circuit 33, from which resultant phase error correction data is fed to the adding circuit 34.

The adding circuit 34 is also supplied with the one cycle data DS from the lock range control circuit 39 and the previous output clock generating timing data through the latch circuit 35. The adding circuit 34 adds them in accumulating fashion and supplies the resultant output clock generating timing data at this time to the comparing circuit 36.

The comparing circuit 36 is also supplied with count data of the master clock signal $CK_{MS}$ from the count circuit 37, and therefore, the comparing circuit 36 compares the count data and the output clock generation timing data to generate digital data $CK_{OUT}$ having a phase corresponding to the timing at which the count data and the output clock generating timing data coincide with each other. This digital data is supplied to a reset input terminal of the one cycle count circuit 38 and to a clock input terminal of the phase error detecting circuit 33. Simultaneously, this digital data is supplied to the outside as the output clock signal $CK_{OUT}$.

The one cycle count circuit 38 in the lock range control circuit counts the period between, for example, the leading edges of the output clock signal $CK_{OUT}$ supplied to the reset input terminal thereof, that is, the number of leading edges of the master clock signal $CK_{MS}$ of one cycle, or the number of cycles, and supplies one cycle period detected data $D_{CNT}$, to the lock range control circuit 39.

The lock range control circuit 39 has a central frequency one cycle period data and boundary frequency one cycle period data, and determines whether or not the input one cycle period detected data $D_{CNT}$ falls within the range of the boundary frequency one cycle period data. If the input one cycle period data $D_{CNT}$ falls within the boundary frequency one cycle period data, then the lock range control circuit 39 supplies the one cycle period detected data $D_{CNT}$ to the adding circuit 34 as the one cycle data DS. If the input one cycle period data $D_{CNT}$ is outside of the range of the boundary frequency one cycle period data, the lock range control circuit 39 supplies, instead of the one cycle period detected data $D_{CNT}$, the central frequency one cycle data to the adding circuit 34 as the one cycle period data DS.

The central frequency one cycle period data is formed of, for example, the number of cycles of the master clock signal $CK_{MS}$ corresponding to one cycle period of the bit clock frequency (e.g., 9.4 MHz) involved in the input digital signal $S_{IN}$. On the other hand, the boundary frequency one cycle period data is formed of the number of cycles of the master clock signal $CK_{MS}$ corresponding to one cycle period of frequency (10.8 MHz or 8.0 MHz) in which frequency the pulled-in frequency range of the PLL circuit 30 is selected to be in the range-of, for example, +15%.

As described above, in this embodiment, the PLL circuit 30 extracts the bit clock signal involved in the input digital signal $S_{IN}$ and delivers the output clock signal $CK_{OUT}$ whose phase is correctly synchronized with that of the input digital signal $S_{IN}$. To do this, the PLL circuit 30 clocks on the master clock $CK_{MS}$. The circuit for generating the master clock $CK_{MS}$ is depicted in FIG. 3.

An embodiment of a clock reproducing circuit according to the present invention will now be described with reference to FIG. 3 in which like parts corresponding to those of FIG. 2 are marked with the same references and therefore need not be described in detail.

Referring to FIG. 3, there is shown a clock reproducing circuit 100 together with the PLL circuit 30 of the present invention. The PLL circuit 30 is supplied with the master clock signal $CK_{MS}$ having a frequency corresponding to the read rate of the reproduced digital signal $S_{PB1}$.

As shown in FIG. 3, a master clock signal generating circuit 120 is formed of a crystal oscillator 130 having a predetermined oscillation frequency. A normal speed master clock signal CK1 of 49.152 MHz from the master clock signal generating circuit 120 is supplied to a first input terminal 140a of a master clock selecting circuit 140 and to a ½ frequency-dividing circuit 150.

The frequency-dividing circuit 150 divides the input normal speed master clock signal CK1 by 2, and a half-speed master clock signal CK2 having a frequency of 24.576 MHz is supplied to a second input terminal 140b of the master clock selecting circuit 140.

The master clock selecting circuit 140 selectively connects its movable contact 140c to the first or second input terminal 140a or 140b in response to an inside control signal CNT inputted thereto from the digital signal processing circuit 15 (see FIG. 1).

If the reproduced digital signal $S_{PB1}$ has a read rate of the normal speed mode, then the master clock selecting circuit 140a connects its movable contact 140c to the first input terminal 140a to permit the normal speed master clock signal CK1 having frequency 49.152 MHz to be fed to the PLL circuit 30 as the master clock signal $CK_{MS}$. Therefore, the PLL circuit 30 operates on the basis of the master clock signal $CK_{MS}$ formed of the normal speed master clock signal CK1 to extract the bit clock signal of 9.4 MHz from the reproduced signal $S_{PB1}$, that is, the input digital signal $S_{IN}$. As a result, the PLL circuit 30 can deliver the reproduced clock signal $CK_{OUT}$ having a frequency of 9.4 MHz in synchronism in the phase with the input digital signal $S_{IN}$.

If, on the other hand, the reproduced digital signal $S_{PB1}$ has a read out rate corresponding to the half speed mode, then the master clock selecting circuit 140 connects its movable contact 140c to the second input terminal 140b to permit the half speed master clock signal CK2 of 24.576 MHz, that is, ½ times the normal speed master clock signal CK1 to be fed to the PLL circuit 30 as the master clock signal $CK_{MS}$. Thus, the PLL circuit 30 operates on the basis of the master clock signal $CK_{MS}$ which is formed of the half speed master clock signal CK2 to extract the bit clock signal of 4.7 MHz from the reproduced digital signal $S_{PB1}$, that is, the input digital signal $S_{IN}$, whereby the reproduced clock signal $CK_{OUT}$ of 4.7 MHz in synchronism in phase with the input digital signal $S_{IN}$ can be derived therefrom.

According to the above-described arrangement, since the frequency of the master clock signal $CK_{MS}$ is determined in accordance with the read out rate of the reproduced digital signal $S_{PB1}$, it is possible to realize the PLL circuit 30 which can correctly reproduce the bit clock signal involved in the reproduced digital signal $S_{PB1}$ to deliver the reproduced clock signal $CK_{OUT}$ if the read out rate of the reproduced digital signal $S_{PB1}$ is the normal speed mode or the half speed mode.

Further, while the PLL circuit 30 is selectively supplied with the normal speed master clock signal CK1 or the half speed master clock signal CK2 which results from dividing the normal speed master clock signal CK1 by 2 through the frequency dividing circuit 150, the present invention is not limited thereto. Alternatively, the crystal oscillator 130 for the master clock generating circuit 120 can be replaced in response to the read out rate of the reproduced digital signal $S_{PB1}$, by which the circuit arrangement thereof can be simplified very much.

An embodiment of the lock range control circuit used in the PLL circuit 30 of the present invention will hereinafter be described with reference to FIG. 4. In FIG. 4, like parts corresponding to those of FIG. 2 are marked with the same references and therefore need not be described in detail.

Referring to FIG. 4, there is shown a lock range control circuit that is generally represented by reference numeral 39. One cycle period detecting data $D_{CNT}$ from the one cycle period counting circuit 38 is supplied to a first input terminal 220a of a one cycle data selecting circuit 220 and to an upper limit value comparing circuit 230A and a lower limit value comparing circuit 230B.

A normal speed mode frequency information generating circuit 240A generates central frequency one cycle period data $DF_{SC}$, upper limit value frequency one cycle period data $DF_{SU}$ and boundary frequency one cycle period data formed of lower limit value frequency one cycle period data $DF_{SD}$. The data $DF_{SC}$ is supplied to the stationary terminal 250a of a central frequency one cycle period data selecting circuit 250. The data $DF_{SU}$ is supplied to the stationary terminal 260a of an upper limit value frequency one cycle period data selecting circuit 260. The data $DF_{SD}$ is supplied to the stationary terminal 270a of a lower limit value frequency one cycle period data selecting circuit 270.

In this embodiment, the normal speed mode frequency value generating circuit 240A responds to the bit lock signal frequency, 9.4 MHz corresponding to the normal speed mode read out rate to generate the central frequency one cycle period data $DF_{SC}$ formed of the periodicity of the master clock signal $CK_{MS}$ corresponding to one cycle period of the frequency, 9.4 MHz and the upper limit value frequency one cycle period data $DF_{SU}$ and the lower limit value frequency one cycle period data $DF_{LD}$ formed of the periodicities of the master clock signals $CK_{MS}$ corresponding to one cycle period of frequencies 10.8 MHz and 8.0 MHz which fall in a range of from +15 % of the frequency, 9.4 MHz.

A half speed mode frequency information generating circuit 240B generates central frequency one cycle period data $DF_{LC}$, upper limit value frequency one cycle period data $DF_{LU}$, and boundary frequency one cycle period data formed of lower limit value frequency one cycle period data $DF_{LD}$. The data $DF_{LC}$ is supplied to the stationary terminal 250b of the central frequency one cycle period data selecting circuit 250. The data $DF_{LU}$ is supplied to the stationary terminal 260b of the upper limit value frequency one cycle period data selecting circuit 260. The data $DF_{LD}$ is supplied to the stationary terminal 270b of the lower limit value frequency one cycle period data selecting circuit 270.

The half speed mode frequency value generating circuit 240B responds to the frequency, 4.7 MHz of the bit clock signal corresponding to the half speed mode read out rate to generate central frequency one cycle period data $DF_{LC}$ formed of the periodicity of the master clock signal $CK_{MS}$ corresponding to one cycle period of the frequency, 4.7 MHz and upper limit value frequency one cycle period data $DF_{LU}$ and lower limit value frequency one cycle period data $DF_{LD}$ formed of the periodicities of the master clock signal $CK_{MS}$ corresponding to the one cycle period of the frequencies, 5.4 MHz and 4.0 MHz which fall in a range of from − +15% of the frequency 4.7 MHz, respectively.

The central frequency one cycle period data selecting circuit 250, the upper limit value frequency one cycle period data selecting circuit 260 and the lower limit value frequency one cycle period data selecting circuit 270 selectively connect their third terminals 250c, 260c and 270c to the first or second input terminals 250a, 260a, 270a or 250b, 260b, 270b in response to an internal control signal having the predetermined read out rate from the digital signal processing circuit 15.

Thus, the one cycle data selecting circuit 220, the upper limit value comparing circuit 230A and the lower limit value selecting circuit 230B are respectively supplied from the switch arm terminals 250c, 260c, and 270c of the selecting circuits 250, 260 and 270, respectively, with central frequency one cycle period data $DF_{SC}$ or $DF_{LC}$, upper limit value frequency one cycle period data $DF_{SU}$ or $DF_{LU}$ and boundary frequency one cycle period data formed of lower limit value frequency one cycle period data $DF_{SD}$ or $DF_{LD}$.

The upper limit value comparing circuit 230A compares the determined upper limit value frequency one cycle period data $DF_U$ ($DF_{SU}$ or $DF_{LU}$) with the input one cycle period detecting data $D_{CNT}$ and generates upper limit value compared data $DT_U$ of a logic level [H] (i.e., high level) when the one cycle period detecting data $D_{CNT}$ is smaller than the upper limit value frequency one cycle period data $DF_U$. This upper limit value compared data $DT_U$ is supplied to one input of an AND circuit 280.

The lower limit value comparing circuit 230B compares the determined lower limit value frequency one cycle period data $DF_D$ ($DF_{SD}$ or $DF_{LD}$) with the incoming one cycle period detecting data $D_{CNT}$ and generates lower limit value compared data $DT_D$ of a logic level [H] (i.e., high level) when the one cycle period detected data $D_{CNT}$ is larger than the lower limit value frequency one cycle period data $DF_D$. This lower limit value compared data $DT_D$ is supplied to another input of the AND circuit 280.

Accordingly, the AND circuit 280 supplies the one cycle data selecting circuit 220 with the control signal CNT which goes to a logic level [H] when the one cycle period data detected data $D_{CNT}$ lies between the upper limit value frequency one cycle period data $DF_U$ and the lower limit value frequency one cycle period data $DF_D$ and which goes to a logic level [L] (i.e., low level) when the one cycle period detected data $D_{CNT}$ does not lie between the upper limit value frequency one cycle period data $DF_U$ and the lower limit value frequency one cycle period data $DF_D$.

Thereby, the one cycle data selecting circuit 220 connects its third terminal 220c to the first input terminal 220a when the control signal CNT is at a logic level [H] and to the second input terminal 220b when the control signal CNT is at a logic level [L], respectively.

As described above, the lock range control circuit 39 detects the one cycle period detected data $D_{CNT}$ formed of the periodicity of the master clock signal $CK_{MS}$ involved in one cycle period of the output clock signal $CK_{OUT}$ and also determines whether or not the one cycle period detected data $D_{CNT}$ falls within a range of the upper limit value and the lower limit value frequency one cycle period data $DF_U$ and $DF_D$ determined in response to the read out rate of the reproduced digital signal $S_{PB1}$. If the one cycle period data detected data $D_{CNT}$ lies in the above-described range, the lock range control circuit 39 transmits the incoming one cycle period detected data $D_{CNT}$ as one cycle data DS, whereas if not so, the lock range control circuit 39 transmits the central frequency one cycle data $DF_c$ as the one cycle data DS instead of the one cycle period detected data $D_{CNT}$.

In the aforenoted circuit arrangement, if the reproduced digital signal $S_{PB1}$ has the normal speed mode read out rate, the central frequency one cycle period data selecting circuit 250, the upper limit value frequency one cycle period data selecting circuit 260 and the lower limit value frequency one cycle period data selecting circuit 270 selectively connect their movable or third terminals 250c, 260c and 270c to their first input terminals 250a, 260a and 270a, respectively, in response to the internal control signal from the digital signal processing circuit 15. Thus, the central frequency one cycle period data $DF_{SC}$, the upper limit value frequency one cycle period data $DF_{SD}$ and the lower limit value frequency one cycle period data $DF_{SD}$ corresponding to the bit clock frequency, 9.4 MHz generated from the normal speed mode frequency value generating circuit 240A are set in the one cycle period data selecting circuit 220, the upper limit value comparing circuit 230A and the lower limit value comparing circuit 230B, respectively.

In the foregoing manner, the PLL circuit 30 extracts the bit clock signal having the frequency of 9.4 MHz from the reproduced digital signal $S_{PB1}$, i.e., the input digital signal $S_{IN}$ with the result that the PLL circuit 30 can deliver the reproduced clock signal $CK_{OUT}$ of 9.4 MHz in synchronism with the phase of the input digital signal $S_{IN}$.

If the reproduced digital signal $S_{PB1}$ has the half speed mode read out rate, then the central frequency one cycle period data selecting circuit 250, the upper limit value frequency one cycle data selecting circuit 260 and the lower limit value frequency one cycle data selecting circuit 270 selectively connect their movable or third input terminals 250c, 260c and 270c to their second input terminals 250b, 260b and 270b, respectively, in response to the internal control signal from the digital signal processing circuit 15, whereby the central frequency one cycle period data $DF_{LC}$, the upper limit value frequency one cycle period data $DF_{LU}$ and the lower limit value frequency one cycle period data $DF_{LD}$ corresponding to the bit clock frequency of 4.7 MHz generated in the half speed mode frequency value generating circuit 240B are set in the one cycle data selecting circuit 220, the upper limit value comparing circuit 230A and the lower limit value comparing 230B, respectively. Thus, the PLL circuit 30 extracts the bit clock signal of 4.7 MHz from the reproduced digital signal $S_{PB1}$, i.e., the input digital signal $S_{IN}$ with the result that the PLL circuit 30 can deliver the reproduced clock signal $CK_{OUT}$ of 4.7 MHz in synchronism with the phase of the input digital signal $S_{IN}$.

According to the circuit arrangement as set forth above, the central frequency one cycle period data $DF_C$ (i.e., $DF_{SC}$, $DF_{LC}$), the upper limit value frequency one cycle period data $DF_U$ (i.e., $DF_{SU}$, $DF_{LU}$) and the lower limit value frequency one cycle period data $DF_D$ ($DF_{SD}$, $DF_{LD}$) corresponding to the read out rate of the reproduced digital signal $S_{PB1}$ are set in the one cycle data selecting circuit 220, the upper limit value comparing circuit 230A and the lower limit value comparing circuit 230B, respectively. Then, if the one cycle period detected data $D_{CNT}$ derived from the one cycle period counting circuit 38 falls within the range of the upper limit value frequency one cycle period data $DF_U$ and the lower limit value frequency one cycle period data $DF_D$, the one cycle period detected data $D_{CNT}$ is supplied to the adding circuit 34 as the one cycle data DS. If the one cycle period detected data $D_{CNT}$ is outside of the above described range, the central frequency one cycle period data $DF_C$ is supplied to the adding circuit 34 as the one cycle data DS instead of the one cycle period detected data $D_{CNT}$. Therefore, a PLL circuit 30 can be realized which precisely extracts the bit clock signal involved in the reproduced digital signal $S_{PB1}$ and delivers the reproduced clock signal $CK_{OUT}$ regardless of whether the read out rate of the reproduced digital signal $S_{PB1}$ is the normal speed mode or the half speed mode.

In the aforenoted embodiments, the central frequency one cycle period data, the upper limit value frequency one cycle period data and the lower limit value frequency one cycle period data generated from the normal speed mode frequency value generating circuit or the half speed mode frequency value generating circuit are selectively set in the one cycle data selecting circuit, the upper limit value comparing circuit and the lower limit value comparing circuit. Alternatively, such a variant is also possible that the central frequency one cycle period data, the upper limit value frequency one cycle period data and the lower limit value one cycle period data corresponding to the read out rates of the reproduced digital signal may be set in the one cycle period data selecting circuit, the upper limit value comparing circuit and the lower limit value comparing circuit from the outside, respectively.

While the PLL circuit of the invention is used to extract the bit clock signal from the reproduced digital signal in a digital audio tape recorder in the above-described embodiments, the present invention is not limited thereto. The present invention can be suitably applied to a wide variety of PLL circuits which extract bit clock signals from digital signals having different transmission rates.

Having described preferred embodiments of the invention with reference to the accompanying drawings, it is to be understood that the invention is not limited to those precise embodiments and that various changes and modifications could be effected by one skilled in the art without departing from the spirit or scope of the novel concepts of the invention as defined in the appended claims.

I claim as my invention:

1. A phase locked loop circuit in of the type which includes means for detecting a phase error between a reproduced input digital signal having a first or second transmission rate and an output digital signal on the basis of an input reference clock signal and means for controlling the frequency of the output digital signal in response to the phase error, wherein the phase locked loop circuit is characterized by means responsive to the firs or second transmission rate of the input digital signal for selectively controlling the frequency of the input reference clock signal in response thereto.

2. A phase locked loop circuit comprising
   a) phase comparator means for detecting a phase error between a reproduced input digital signal having a first or second transition rate and an output digital signal and for controlling the frequency of the output digital signal in response to the phase error;
   b) lock range setting means for setting a first or second central frequency value and a first or second boundary frequency value in response to the first or second transmission rate;
   c) lock range determining means for determining whether or not the frequency value of the output digital signal falls within the range of the first or second boundary frequency values set by the lock range setting means; and
   d) frequency setting means for controlling the phase comparator means to cause the output digital signal to have a frequency corresponding to the first or second central frequency values determined by the lock range setting means on the basis of determined result of the lock range determining means if the frequency value of the output digital signal lies outside of the first or second boundary frequency values.

3. A phase locked loop method comprising the steps of detecting the phase error between a reproduced input digital signal having a first or second transmission rate and an output digital signal on the basis of an input reference clock signal and controlling the frequency of the output digital signal in response to the phase error, wherein the phase locked loop method is characterized by the steps of:
   detecting which of the first or the second transmission rates the input digital signal has; and
   selectively controlling the frequency of the input reference clock signal in response to the detected transmission rate of the input digital signal.

4. A phase locked loop method comprising the steps of detecting the phase error between a reproduced input digital signal having a first or second transmission rate and an output digital signal and controlling the frequency of the output digital signal in response to the phase error, wherein the phase locked loop method comprises the steps of:
   a) setting a first or second central frequency value and a first or second boundary frequency value in response to the first or second transmission rate;
   b) determining whether or not the frequency value of the output digital signal falls within the range of the first or second boundary frequency values set by the preceding step; and
   c) controlling the output digital signal to have a frequency corresponding to the first or the second central frequency values if the frequency value of the output digital signal lies outside of the first or second boundary frequency values.

5. A phase locked loop circuit comprising:
   phase comparator means for detecting the phase difference between a reproduced digital signal having a first or second transmission rate and an output digital signal and for controlling the frequency of the output digital signal in response to the phase error, the phases comparator means carrying out the detecting and output digital signal frequency controlling operations at the timing of a master reference clock signal;
   master clock signal generating means for generating master clock signals at first and second frequencies corresponding to the first and second transmission rates of the reproduced digital signal;
   means for detecting the transmission rate of the reproduced digital signal and selectively supplying to the phase comparator means as the master reference clock signals the master clock signals at the first frequency when the reproduced digital signal has the first transmission rate and for supplying the master clock signals at the second frequency when the reproduced digital signal has the second transmission rate.

6. A phase locked loop method comprising the steps of:
   (a) detecting the phase difference between a reproduced digital signal having a first or second transmission rate and an output digital signal and for controlling the frequency of the output digital signal in response to the phase error, wherein the detecting and output digital signal frequency controlling operations are carried out at the timing of a master reference clock signal;
   (b) generating master clock signals at first and second frequencies corresponding to the first and second transmission rates of the reproduced digital signal;
   (c) detecting the transmission rate of the reproduced digital signal and selectively using as the master reference clock signals in step (a) the master clock signals at the first frequency when the reproduced digital signal has the first transmission rate and the master clock signals at the second frequency when the reproduced digital signal has the second transmission rate.

* * * * *